United States Patent [19]

DiVincenzo

[11] Patent Number: 5,530,263

[45] Date of Patent: Jun. 25, 1996

[54] THREE DOT COMPUTING ELEMENTS

[75] Inventor: David P. DiVincenzo, Chappaqua, N.Y.

[73] Assignee: International Business Machines Corporation, Armonk, N.Y.

[21] Appl. No.: 291,306

[22] Filed: Aug. 16, 1994

[51] Int. Cl.$^6$ ............ H01L 29/06; H01L 31/0328; H01L 29/18; H01L 31/0336

[52] U.S. Cl. .................. 257/14; 257/9; 257/24; 257/42; 257/183

[58] Field of Search .................. 257/9, 12, 14, 257/24, 42, 183, 15, 22

[56] References Cited

FOREIGN PATENT DOCUMENTS 5-95111   4/1993   Japan ...................... 257/14

OTHER PUBLICATIONS

Charles Kittel, "Introduction to Solid State Physics", Sixth Edition, 1986, John Wiley & Sons, Inc., pp. 393–460.
"Quantum Computing Creeps Closer to Reality" J. Horgan Scientific American, Apr. 1994 p. 18.
"A Potentially Realizable Quantum Computer" S. Lloyd Science V. 261 Sep. 17, 1993 pp. 1569–1571.
"Novel Magnetic Phase Transition Behavior In Short Period EuTe/Pb . . ." J. J. Chen et al Solid–State Electronics V37 #4–6 pp. 1073–76 1994.

*Primary Examiner*—Steven H. Loke
*Attorney, Agent, or Firm*—Stephen S. Strunck

[57] ABSTRACT

There is provided by this invention logic and memory elements of atomic or near-atomic scale useful in computer central processing units. These elements consist of two quantum dots having opposite states and a third quantum dot situated between the two quantum dots and in physical contact with them. The third quantam dot is of a material which makes the opposite states of the first two quantum dots energetically favorable. In particular, there is provided by the invention a spin flip-flop suitable for use as electronic logic and memory in a quantum computer. The spin flip-flop is designed to have two highly stable states, encoded entirely in the arrangement of electronic spins in the structure. Switching between the two states is accomplished by fast electromagnetic pulsing generally and by optical pulsing in the case of the spin flip-flop. The two stable states are the up-down and the down-up spin states of two single electrons placed into two neighboring electronic quantum dots typically by doping or by a field effect. The operation of the device is facilitated and stabilized by the presence of a small particle or dot of an antiferromagnetic material placed between the two electronic dots, and in physical contact with both of them.

7 Claims, 2 Drawing Sheets

THREE DOT COMPUTING ELEMENTS

BACKGROUND OF THE INVENTION

This invention relates to data and logic elements for a central processor using atomic-scale or near-atomic-scale structures.

In conventional computers, electrical charge or its absence represent the 0's and 1's used in the binary language of data storage. In a quantum computer, the energy levels of individual particles or clusters of particles would represent the information. According to quantum mechanics, such energy levels are discrete states. Thus, the ground or down state would represent a 0 and the excited or up state would represent a 1.

There is presently no satisfactory physical implementation for the data and logic elements of a central processor using atomic-scale or near-atom-scale structures. Such an implementation would be needed to build processors which are smaller and faster than any which can be built in existing semiconductor transistor technology.

SUMMARY OF THE INVENTION

There is provided by this invention logic and memory elements of atomic or near-atomic scale useful in computer central processing units. Each element consists of two quantum dots having opposite states and a third quantum dot situated between the two quantum dots and in physical contact with them. The third quantum dot is of a material which makes the opposite states of the first two quantum dots energetically favorable. In particular, there is provided by the invention a spin flip-flop suitable for use as electronic logic and memory in a quantum computer. The spin flip-flop is designed to have two highly stable states, encoded entirely in the arrangement of electronic spins in the structure. Switching between the two states is accomplished by fast electromagnetic pulsing generally and by optical pulsing in the case of the spin flip-flop. The two stable states are the up-down and the down-up spin states of two single electrons placed into two neighboring electronic quantum dots typically by doping or by a field effect. The operation of the device is facilitated and stabilized by the presence of a small particle or dot of an anti-ferromagnetic material placed between the two electronic dots, and in physical contact with both of them.

BRIEF DESCRIPTION OF THE DRAWINGS

Other features and advantages of the present invention will be apparent from the following description taken in connection with the accompanying drawings, wherein.

DETAILED DESCRIPTION OF THE INVENTION

A quantum dot is a small piece of a substance (commonly a semiconductor such as Si or GaAs, but possibly also a metal, a magnet or an antiferromagnetic) having a small size (typically between 1 nm and 10 nm) in all three dimensions. These small dimensions may be achieved by photolithography, etching, shadow masking, thin film deposition, or any of a number of other techniques available today in the materials processing and semiconductor industries. The quantum dot is distinguished functionally by having only a few discrete states in which it can exist, for example, having one or zero extra electrons, having an excess spin up or down, having its magnetization vector point up or down, or having an electron in its first, second, or higher excited state. These states may or may not be stabilized by gating, optical excitation, or other control devices. The quantum dot, however, is defined by its inherent characteristics, not by the nature of the control devices.

Figure 1:
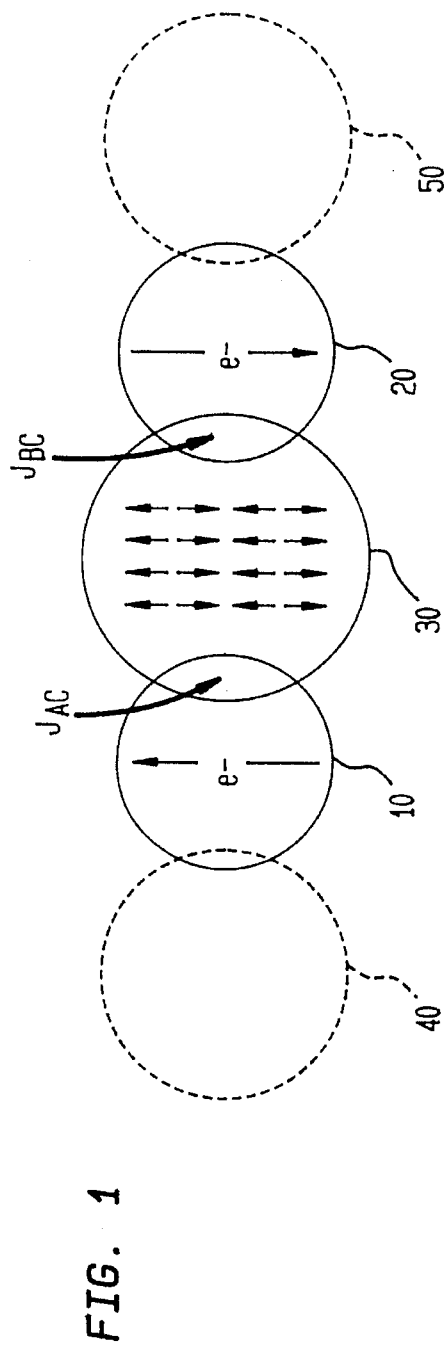
FIG. 1 is a schematic, plan view representation of a three dot spin flip-flop computing element.

A three-dot computing element of the present invention, the spin flip-flop, is shown in FIG. 1 where dots 10 and 20 are one-electron quantum dots, dot 30 is an insulating antiferromagnetic dot and dots 40 and 50 are interconnecting antiferromagnetic dots. The three dot design of the present invention has an intrinsic method for stabilizing the two states of dots 10 and 20. In particular, antiferromagnetic dot 30 has at least the following three properties:

a) the state of the computing element is encoded by thousands or tens of thousands of individual electrons in 30, and is thus a very stable method of encoding;

b) despite its relatively large size dot 30 can switch very fast (on the order of 800 fsec) because of the intrinsic physics of antiferromagnetic systems; and c) antiferromagnetic dots 40 and 50 provide a very reliable and robust means of interconnecting neighboring computing elements.

The interaction mechanism exploited in the present invention is "direct exchange", arising quantum-mechanically from the direct overlap (and resulting operation of the Pauli exclusion principle) between the electron in the one-electron quantum dot and the electrons in the antiferromagnet. It is expected from quantum-mechanical theory, and it is known from empirical study, that this is a very stable form of interconnection, with the interaction strength depending linearly on the overlap area between dots 10 and 30 or 10 and 40 which area can be fairly large (perhaps several hundred or so squared-nm's). Further, in the present invention, since antiferromagnetic dots 30, 40 and 50 are electrically insulating no leakout of electrons from the quantum dots is permitted.

It is envisioned that the device may be fabricated by extensions of the present art in semiconductor fabrication technology. Having been so fabricated, the energy levels and dynamics of the device can be described using the following approximate Hamiltonian:

$$H=(g_A\mu_B H_{ext}\hat{z}+J_{AC}\hat{\phi})\cdot\vec{\sigma}^A+(g_B\mu_B H_{ext}\hat{z}+J_{AB}\hat{\phi})\cdot\vec{\sigma}^B-K_C\cos^2(\phi-\phi_0).$$

Here $g_A$ and $g_B$ are the g-factors of the electrons in dots 10 and 20, which are assumed to be made different by using different semiconductor compositions, different shapes, and/or different sizes for dots 10 and 20; $H_{ext}$ is the externally applied magnetic field, assumed to be applied in the $\hat{z}$ direction $J_{AC}$ and $J_{BC}$ are the aforementioned exchange coupling interactions, which are assumed to have opposite signs. This may be accomplished, for example, by causing dots 10 and 20 to be in intimate physical contact with different atomic layers of a layered antiferromagnet in dot 30. $\hat{\phi}$ is a unit vector in the direction in which this exchange interaction acts, which denotes the direction of the Néel vector in antiferromagnetic dot 30; it is a c-number in the present approximation. $\vec{\sigma}^{A,B}$ are the spin-½ quantum operators representing the spins of the two electrons in the electron quantum dots 10 and 20. The final term of the equation represents the magnetic anisotropy energy of the antiferromagnet 30. It is assumed to be uniaxial with amplitude $K_c$. The easy axis of the antiferromagnet is not assumed to be colinear with $H_{ext}$, but is taken to be tipped from it by angle $\phi_0$.

Figure 2:
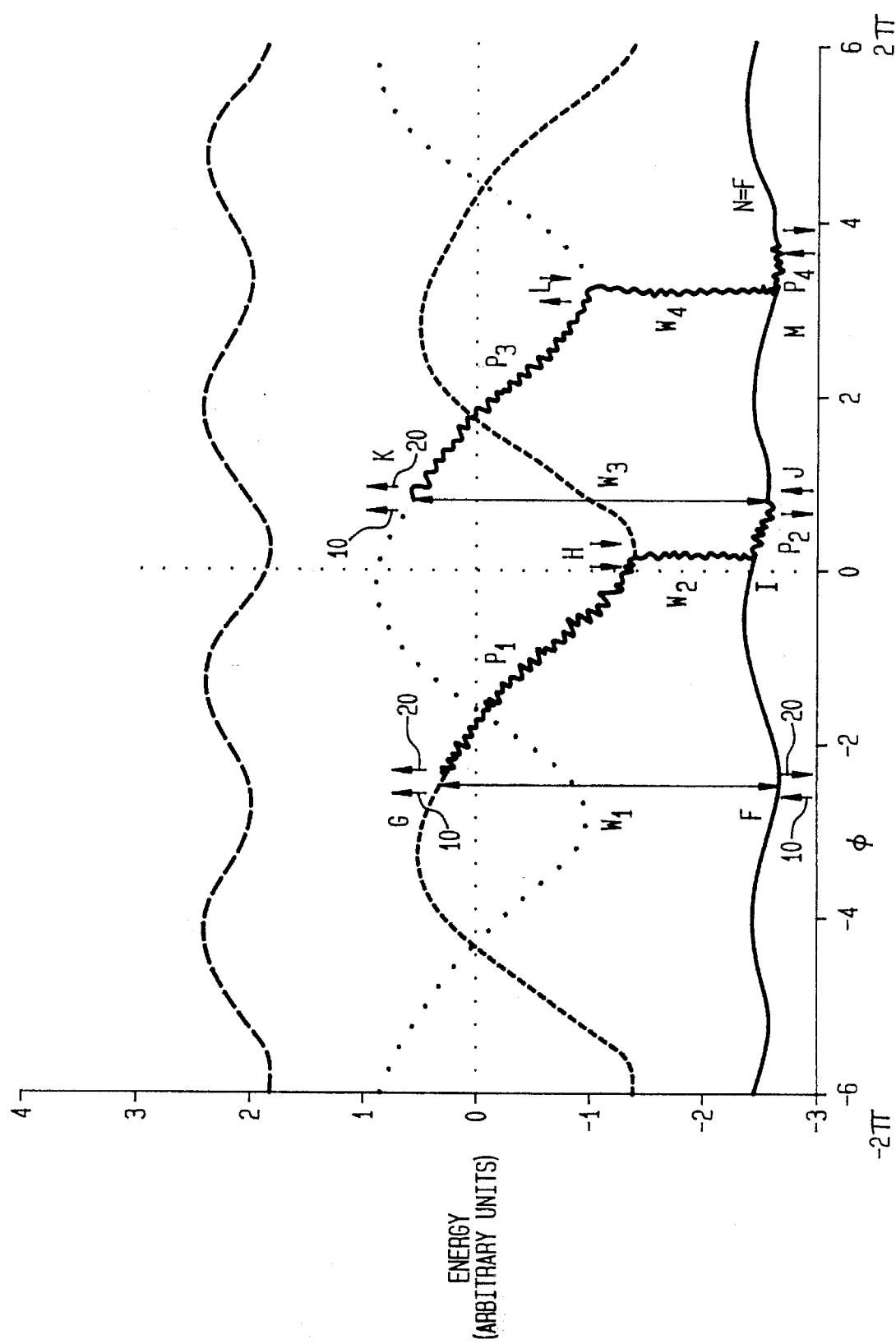
FIG. 2 is an energy-level diagram depicting the switching process of a three dot spin flip-flop computing element.

The four energy levels of the two electrons as a function of the angle of the Néel vector $\phi$ is shown in FIG. 2. The action of the flip-flop proceeds as follows. Suppose that the system begins in its ground state F. The system can be pumped by an electromagnetic pulse with frequency $\omega_1$, which will flip over the spin of dot 10, placing the system in excited state G. In this state the antiferromagnet 30 has a torque exerted on it, which is given by the slope of the curve at G. The system will therefore travel down path $P_1$, at the rate determined by the moment of inertia of antiferromagnetic dot 30, and by the magnitude of frictional forces in the system. During this evolution, the states of the two spins on 10 and 20 will rotate adiabatically as the Néel vector rotates. The system will reach a metastable state H, which will relax back to state I by spontaneous or stimulated emission of radiation at frequency $\omega_2$. By further adiabatic rotation, the system will arrive at state J. State J is distinct from state F, has higher energy than it, but is highly stable with respect to relaxation to state F. States J and F are the two states of the flip-flop.

An exactly analogous process permits the system to be switched back, involving absorption at frequency $\omega_3$, adiabatic relaxation along path $P_3$, emission of radiation of frequency $\omega_4$, and further relaxation to final state N, which is identical to F. The Hamiltonian as specified permits all the frequencies $\omega_i$ to be distinct, which assists in the controlled switching of the device.

Figure 3:
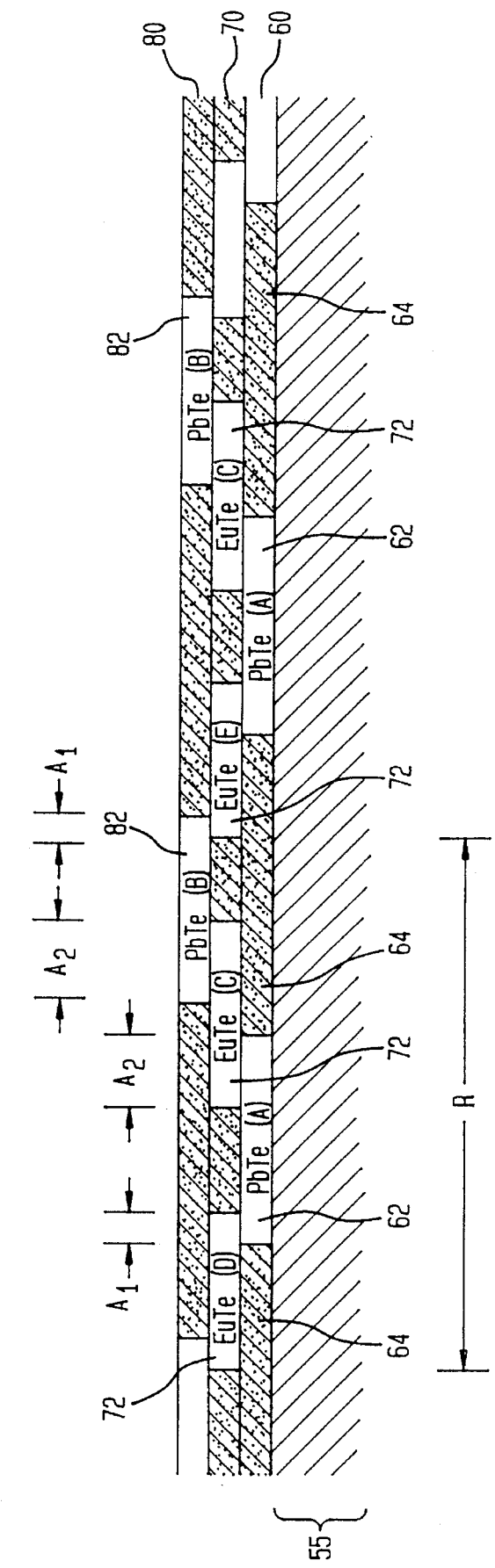
FIG. 3 is a one-dimensional cross section illustration of one embodiment of the present invention produced by the use of semiconductor thin-film-deposition technology.

FIG. 3 shows a one-dimensional cross section of an implementation of the present invention using semiconductor thin-film-deposition technology. The semiconductor PbTe has many of the correct materials parameters to be used for the one-electron quantum dots, while EuTe has many of the correct parameters to be used for the antiferromagnetic dots. Layer 60 is created by first depositing a uniform thin film of PbTe on substrate 55, then by suitable patterning techniques (e-beam lithography, x-ray lithography, holography), selectively removing PbTe material, leaving behind dots 62 of PbTe with lateral dimensions on the order of a few 10's of nm. The gaps may be filled in with another wide-gap, non-magnetic semi-conductor such as ZnTe shown at 64. Substrate 55 should be a wide-gap, non-magnetic semiconductor having a good lattice match with the semiconductors of layer 60. Layer 60 should then be "planarized" to complete layer 60 and leave an atomically smooth surface for layer 70.

The deposition of layer 70 involves the same steps as for layer 60 except EuTe, 72, an antiferromagnetic insulator, is substituted for PbTe. The desired thickness of layer 70 (about 1.5 nm) should be less than layer 60. Layer 70 may be deposited, for example by the use of the molecular beam epitaxy (MBE) deposition technique. For the spin flip-flop to function properly, layer 70 must have an even number of atomic monolayers. The physics of this requirement are discussed in the paper by Chen, et al., in Solid State Electronics, Vol. 37, Nos. 4–6, pp. 1073–1076 (1994), which paper is herein incorporated by reference. Layer 80 processing is identical to that of layer 60. The three dot device must also be gated or doped to supply electrons to quantum dots 62 and 82. This may be done, for example, by introducing dopants into the substrate, into the wide-gap, non-magnetic semiconductors 64, 74 and/or 84. The device may also be provided with an encapsulant over the surface of surface 80 which encapsulant may also be gated or doped.

As shown in FIG. 3, the antiferromagnetic dot 30, the one-electron dots 10 and 20, and the interconnection dots 40 and 50, are thereby created. Particularly, the first, left-most EuTe (D) dot 72 of layer 70 of FIG. 3 corresponds to dot 40 of FIG. 1; the first PbTe (A) dot 62 of layer 60 in contact with the first EuTe dot corresponds to dot 10 of FIG. 1; and the second EuTe (C) dot 72 of layer 70 in contact with the first PbTe (A) dot corresponds to dot 30 of FIG. 1. It should be noted from FIG. 3 that the contact area ($A_1$) between the first EuTe dot and the first PbTe dot is less, by design to preserve the structure of the energy levels of FIG. 2, than the contact area ($A_2$) between the first PbTe dot and the second EuTe dot. Similarly, progressing to the right in the structure of FIG. 3, the next-most PbTe (B) dot in layer 80 and EuTe (C) dot in layer 70 correspond to dots 20 and 50, respectively in FIG. 1. Again, as shown in FIG. 3, the interface area ($A_2$) between the EuTe dot of layer 70 and the PbTe dot of layer 80 is greater, by design, than the interface area ($A_1$) of the PbTe dot of layer 80 and the next-most EuTe dot. The structure is repetitive with period R, as indicated in FIG. 3. The device of FIG. 3 contemplates use as a memory device. For use as other devices, e.g., general purpose logic, modifications in the physical parameters of successive three dot devices may be required as is known in the art. Data is read into the spin flip-flop of FIG. 3 by setting it to a desired state, such as F or J of FIG. 2, which represents, in effect a "1" or "0" of the commonly used binary computer language. Assuming that it is desired to place the device into state J, this may be done, for example, by illuminating the device with an electromagnetic pulse of frequency $\omega_1$ for a time sufficient to place it on the upper energy surface at point G. As previously explained, the device will thereafter decay to state J. To place the device into state F, it is illuminated with an electromagnetic pulse of frequency $\omega_3$ for a time sufficient to place it on the upper energy surface at point K whereafter it decays to state F.

An example of device read out is to illuminate it with an electromagnetic pulse of frequency $\omega_1$ of a duration to cause it to placed on the upper energy surface at point G, if it was in state F, thereby causing an absorption of a quantum of energy from the electromagnetic pulse. This illumination will cause no change of the state of the device if it was in state J and, therefore, no absorption of a quantum of energy from the electromagnetic pulse. The amount of electromagnetic energy transmitted through the device is measured with a device such as a photodetector, photodiode, antenna or other suitable device. If the intensity of this electromagnetic energy is diminished, then the state of the device is read a F; if it is undiminished, the state of the device is read as J. Alternatively, device read out could be on the basis of radiation of energy of frequencies $\omega_2$ or $\omega_4$.

It will be apparent to those of working skill in the art that modifications of this invention may be practiced without departing from the essential scope of this invention.

I claim:

1. A logic element comprising:

a first quantum dot of a first state;

a second quantum dot of a second state, said second state being different from that of said first state; and a third quantum dot situate between said first and second dots and in physical contact with said first and second dots, said third dot being an insulator.

2. The logic element of claim 1 wherein said first state has one extra electron and said second state has zero extra electrons.

3. The logic element of claim 1 wherein said first state has an excess electron spin of a first orientation and said second state has an excess electron spin orientation opposite to that of said first state.

4. The logic element of claim 1 wherein said first state has a magnetization vector of a first orientation and said second state has a magnetization vector orientation opposite to that of said first state.

5. The logic element of claim 1 wherein said first quantum dot has an electron in an excited state and said second quantum dot has an electron in an excited state which is different from the excited state of said first quantum dot.

6. The logic element of claim 1 wherein said third quantum dot is of a material which makes the states of the first and second quantum dots energetically favorable.

7. A spin flip-flop logic element comprising:

a first quantum dot having an excess electron spin of a first orientation;

a second quantum dot having an excess electron spin of a second orientation, said second orientation being opposite to that of said first orientation; and a third quantum dot situate between said first and second dots and in physical contact with said first and second dots, said third dot being a wide-gap, antiferromagnetic semiconductor.

* * * * *